Figure 1:
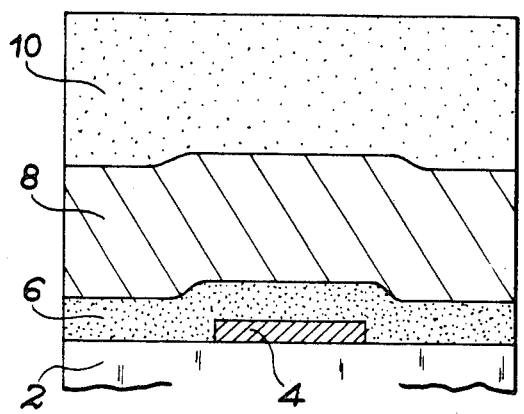

United States Patent [19]

Diem

[11] Patent Number: 4,715,930

[45] Date of Patent: Dec. 29, 1987

[54] PROCESS FOR PRODUCING BY SLOPING ETCHING A THIN FILM TRANSISTOR WITH A SELF-ALIGNED GATE WITH RESPECT TO THE DRAIN AND SOURCE THEREOF

[75] Inventor: Bernard Diem, Meylan, France

[73] Assignee: Commissariat a l'Energie Atomique, Paris, France

[21] Appl. No.: 929,908

[22] Filed: Nov. 13, 1986

[30] Foreign Application Priority Data

Nov. 15, 1985 [FR] France ................... 85 16922

[51] Int. Cl.[4] ............. H01L 21/306; B44C 1/22; C03C 15/00; C03C 25/06
[52] U.S. Cl. ................... 437/101; 156/646; 156/649; 156/651; 156/657; 156/659.1; 156/661.1; 156/662; 357/2; 357/4; 357/23.7; 357/56; 357/65; 437/229; 437/966; 430/313
[58] Field of Search .......... 156/643, 646, 649, 651, 156/657, 659.1, 661.1, 662; 29/571, 576 W, 580, 591; 427/88–90; 430/313, 315, 316; 357/2, 4, 23.1, 23.7, 41, 49, 55, 56, 59, 65, 71

[56] References Cited

U.S. PATENT DOCUMENTS 3,878,008 4/1975 Gleason et al. ............ 156/661.1 X
4,514,252 4/1985 Roland ........................... 156/651 X

FOREIGN PATENT DOCUMENTS 076587 4/1983 European Pat. Off. .
102802 3/1984 European Pat. Off. .
139585 5/1985 European Pat. Off. .
56-73454 6/1981 Japan ........................... 156/643
57-45256 3/1982 Japan ........................... 156/651
0199223 12/1982 Japan ........................... 156/651

OTHER PUBLICATIONS

IEEE Transactions on Electron Devices, vol. 29, No. 11, Nov. 1982, pp. 1798–1805, Wysocki, Joseph J.

Primary Examiner—William A. Powell
Attorney, Agent, or Firm—Kerkam, Stowell, Kondracki & Clarke

[57] ABSTRACT

Process for producing by sloping etching a thin film transistor with a self-aligned gate with respect to its drain and source and transistor obtained by this process. The process consists of producing the transistor gate on a glass substrate, depositing an insulating layer on the substrate and gate, depositing a thick hydrogenated amorphous silicon layer on the insulating layer, depositing a positive photosensitive resin layer on the silicon layer, irradiating the resin layer through the substrate, the gate serving as an irradiation mask, developing the resin, chemically etching by successive, partial operations the silicon layer until the insulating layer is exposed, the remaining resin serving both as a mask and being etched following each etching operation of the silicon layer and producing the electrical contacts and source and drain electrodes of the transistor. Application to the production of active matrixes for liquid crystal flat screens.

2 Claims, 9 Drawing Figures

PROCESS FOR PRODUCING BY SLOPING ETCHING A THIN FILM TRANSISTOR WITH A SELF-ALIGNED GATE WITH RESPECT TO THE DRAIN AND SOURCE THEREOF

BACKGROUND OF THE INVENTION

The present invention relates to a process for producing by sloping etching a thin film transistor with a self-aligned gate with respect to the drain and source thereof and to the transistor obtained by this process.

In general terms, it makes it possible to produce thin film semiconductor components which can be used for the multiplexing of such components arranged in matrix form, as well as for producing charge coupled devices (CCD).

More particularly, it makes it possible to produce thin film transistors (TFT), which can be used in optoelectronics for producing the electronic memory of liquid crystal flat screens. This electronic memory stores the video signal for the duration of the image and is produced in the form of an active matrix of memory points, each being formed from a TFT and a capacitor, whilst being distributed over the entire screen surface. The liquid crystal is in contact with each memory point and is excited for the duration of one image.

A thin film transistor is an insulated gate field effect transistor similar to the MOS transistor (metal-oxide-semiconductor) with the difference that it is produced on an amorphous substrate and not on a monocrystalline silicon wafer. Therefore as they are no longer limited by the size of the crystalline substrate, TFT circuits can have a considerable size.

FR-A2 553 579 discloses a process for the production of a thin film transistor making it possible to align the transistor gate with its drain and source. Unfortunately the edges of the first silicon layer, following the photogravure or photoetching thereof, are vertical and consequently do not provide a good contact and attachment surface for the deposition of a second type n+ silicon layer with a view to producing ohmic contacts.

SUMMARY OF THE INVENTION

The present invention aims at improving the contact surface of the edges of a layer of a material with a fundamentally conducting or semiconducting nature, by sloping etching, in such a way that there is a better deposition of another layer of a fundamentally conducting or semiconducting nature, particularly with a view to obtaining ohmic contacts.

According to the invention this aim is achieved by producing a number of staircase steps on the edges of the layer of material by an equal number of successive, partial etching operations of said layer, the remaining resin serving both as a mask and being itself etched isotropically over a limited thickness following each etching of the material layer.

The term etching means the selective removal by chemical action of a material layer thickness. Generally, a photosensitive resin layer serves as the mask for said etching operation, in order to obtain the desired layer form.

More specifically, the invention relates to a process for producing a thin film transistor with a self-aligned gate with respect to its drain and source and comprising the following successive stages:

(a) producing the transistor gate on a glass substrate;
(b) deposition of an insulating layer on the substrate and gate;
(c) deposition of a thick hydrogenated amorphous silicon layer on the insulating layer;
(d) deposition of a positive photosensitive resin layer on the silicon layer;
(e) irradiation of the resin layer through the substrate, the gate serving as an irradiation mask;
(f) development of the resin layer leading to the elimination of the irradiated zones of said resin layer;
(g) etching the silicon layer until the insulating layer is exposed, the remaining resin serving as a mask for said etching;
(h) producing electric contacts and source and drain electrodes of the transistor; and
(i) elimination of the remaining resin;

wherein a certain number of staircase steps are formed on the edges of the silicon layer by an equal number of successive and partial etching operations of said silicon layer, the remaining resin being used on each occasion as a mask and itself being etched isotropically over a limited thickness following each etching of the silicon layer.

The present invention also relates to a thin film transistor with a self-aligned gate obtained by the process defined hereinbefore and comprising:

(a) the transistor gate on the glass substrate;
(b) an insulating layer on the substrate and gate;
(c) a first hydrogenated amorphous silicon layer on the insulating layer;
(d) a second type n+ hydrogenated amorphous silicon layer on the first silicon layer for producing ohmic contacts;
(e) a second conductive layer on the second silicon layer for producing the source and drain electrodes of the transistor;

wherein the first silicon layer has staircase-type edges constituted by at least two steps.

According to the invention, it is possible to obtain a contact surface, whose quality is a function of the number and shape of the steps which it is possible to produce on the edges of the layer.

The limits to this construction are essentially defined by the etching method used and the thicknesses of the layers of material and resin. This result is obtained by etching the first silicon layer constituting the essential and novel steps of the invention compared with the teaching of FR-A-2 553 579.

The steps obtained on the edges of the first silicon layer have a length equal to the thickness of the resin removed by isotropic etching taking place following each etching of said silicon layer.

It is pointed out that the staircase steps are obtained on the same material layer, which assists the performance of the process and leads to no critical stage.

DESCRIPTION OF THE DRAWINGS AND PREFERRED EMBODIMENTS

The invention is described in greater detail hereinafter relative to a non-limitative embodiment and with reference to the attached FIGS. 1 to 9, which illustrate the various stages of the process according to the invention.

As shown in FIG. 1, the first stage of the process consists of producing on a glass substrate 2, the transistor gate 4 using conventional photolithography processes (masking and etching). Gate 4, which e.g. has a thickness of 100 nm is preferably made from chromium.

This is followed by the deposition on substrate 2 and transistor gate 4 of an insulating layer, preferably made from silicon dioxide. This insulating layer 6 e.g. has a thickness of 100 nm and can be obtained by chemical vapour phase deposition, at low pressure or not, or by luminous discharge in a radio frequency apparatus using a gaseous mixture of SiH$_4$ and O$_2$.

This is followed by the deposition on insulating layer 6 of a first thick hydrogenated amorphous silicon layer 8 advantageously having a thickness between 70 and 100 nm, preferably close to 80 nm. This silicon layer can be obtained by the luminous discharge method using SiH$_4$ gas.

The following stage of the process consists of depositing on the thick amorphous silicon layer 8, a positive photosensitive resin layer 10.

The resin layer advantageously has a thickness between 1000 and 1200 nm and it can be deposited by centrifuging. The resin can be in the form of a phenol-formaldehyde-based resin, like that sold under reference HPR 204 by the HUNT company.

Figure 2:
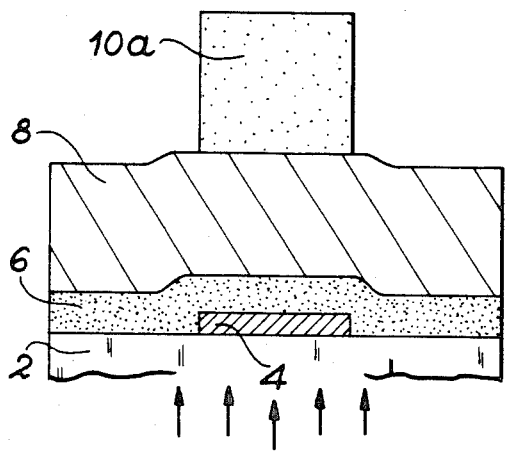

As shown in FIG. 2, the photosensitive resin layer 10 is then irradiated through substrate 2, gate 4 then serving as an irradiation mask. The use of a resin sensitive in the visible range makes it possible to limit the duration of said irradiation (the arrows in FIG. 2 indicating the irradiation direction).

The development of the resin layer makes it possible to only retain zone 10a thereof, which is positioned to the right of the transistor gate, the irradiated zones being eliminated.

Figure 3:
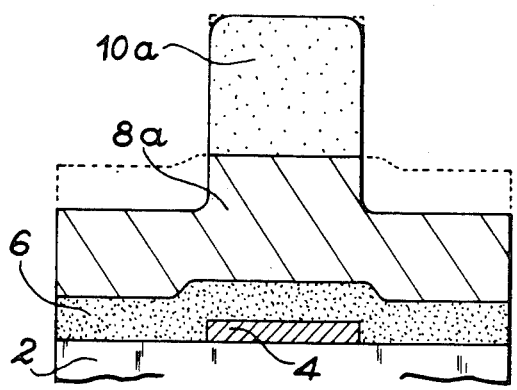

The following stage and which characterizes the invention is the special etching of the first silicon layer 8, which makes it possible to produce a certain number of staircase steps on the edges of said silicon layer. The different operations performed during this etching are shown in FIGS. 3 to 7 by means of the dotted lines enabling the evolution of the process to be followed. As shown in FIG. 3, for a time of roughly 30 minutes reheating or annealing of the resin 10a takes place at a temperature between 100° and 150° C. and preferably close to 130° C. in order to bring about a flow thereof.

This is followed by the etching of part of the thickness of the hydrogenated amorphous silicon layer 8, the remaining resin 10a serving as a mask for the etching operation. A silicon layer 8a is left following said first partial etching.

Preferably dry etching with a sulphur hexafluoride plasma is used. Preferably partial etching is at the minimum equal to one third of the thickness of the initial hydrogenated amorphous silicon layer.

Figure 4:
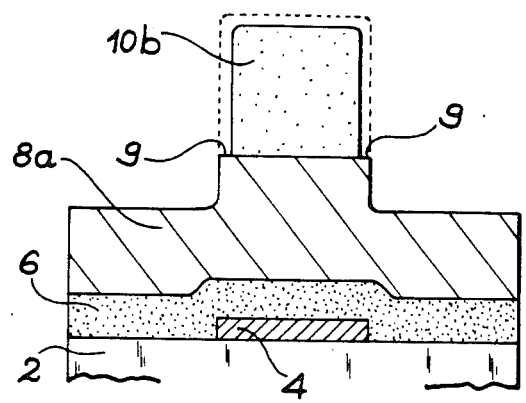

As shown in FIG. 4, the process according to the invention then consists of isotropically etching a limited resin thickness. Etching leads to the appearance of a first break or displacement 9 of width equal to that of the etched resin layer on the apex of the edges of silicon layer 8a. Preferably ionic, reactive, dry etching is used and the remaining resin 10b has a thickness less by approximately 150 nm than that of the initial resin 10a in FIG. 3.

Figure 5:
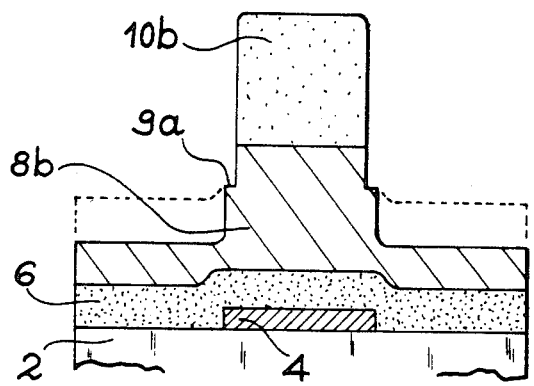

As shown in FIG. 5, etching is repeated of part of the thickness of the silicon layer, the remaining resin 10b serving as a mask for said etching operation. This second partial etching acts in the same way on displacement 9 and leads to the appearance of a first step 9a on the edges of the remaining silicon layer 8b.

Figure 6:
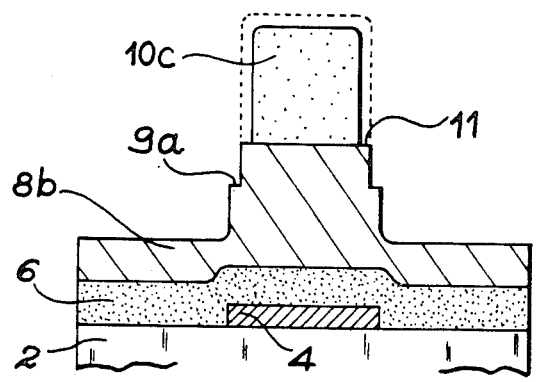

As shown in FIG. 6, isotropic etching is repeated in an identical manner with respect to a limited resin thickness 10b, said etching leading to the appearance of a second displacement 11 on the apex of the edges of silicon layer 8b and having the same length as the thickness of the etched resin layer.

Figure 7:
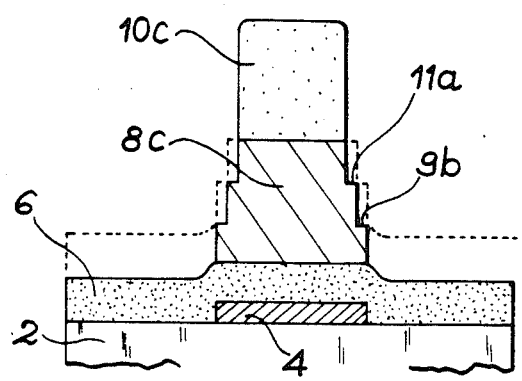

As shown in FIG. 7, the silicon layer etching operation is repeated until the insulating layer 6 is exposed, the remaining resin 10c serving as a mask for said etching operation. This final partial etching operation acts in the same way on the displacement 11 and step 9a (FIG. 6) and leads to the appearance of a second step 11a, which is added to the first step 9b on the edges of the remaining silicon layer 8c (FIG. 7).

In the embodiment described with reference to FIGS. 3 to 7, two successive steps are produced in the silicon layer. Although this constitutes a preferred embodiment, it is also possible without passing beyond the scope of the invention to extend the process to produce more than two steps.

In all cases, it is preferabl for reasons of simplicity of technological performance, that all the etching operations carried out in the silicon layer on the one hand and in the resin on the other are respectively performed by identical methods. Preference is given to dry etching using a sulphur hexafluoride plasma for the silicon layer and an oxygen plasma for the resin.

Figure 8:
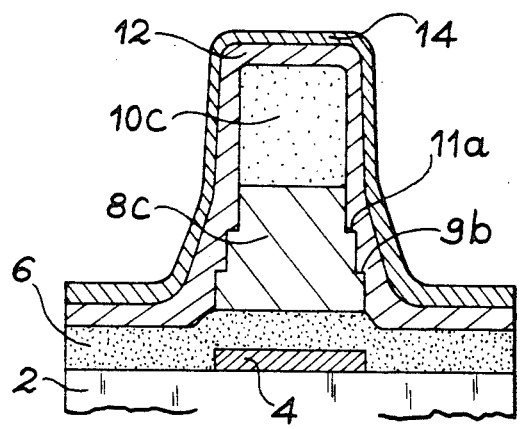

As shown in FIG. 8, the production of the transistor is completed by depositing in known manner on the complete structure, a second hydrogenated or non-hydrogenated, type n$^+$, amorphous silicon layer 12, which e.g. has a thickness of 20 nm. This second silicon layer 12, deposited by the same method as that used for the first silicon layer makes it possible to produce ohmic contacts for the transistor source and drain. This layer 12 is then covered by a conductive layer 14, preferably of chromium. This conductive layer 14 e.g. has a thickness of 150 nm and is obtained by deposition, e.g. by vacuum evaporation or sputtering.

Figure 9:
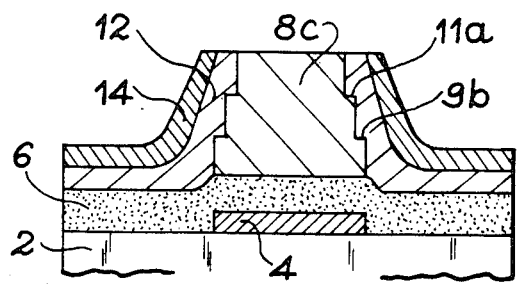

As shown in FIG. 9, it is possible by lift-off to eliminate the regions respectively of conductive layer 14 and the second silicon layer 12 located to the right of the transistor gate 4 and the remaining resin 10c.

Finally, in what remains of the conductive layer 14 are produced the source and drain electrodes of the transistor by conventional photolithography processes (masking and etching).

What is claimed is:

1. A process for producing a thin film transistor with a self-aligned gate with respect to its drain and source comprising the following successive steps:
    (a) producing the transistor gate on a glass substrate;
    (b) depositing an insulating layer on the substrate and the gate;
    (c) depositing a thick hydrogenated amorphous silicon layer on the insulating layer;
    (d) depsiting a positive photosensitive resin layer on the silicon layer;
    (e) irradiating the resin layer through the substrate, the gate serving as an irradiation mask;
    (f) developing the resin layer leading to the elimination of the irradiated zones of said resin layer;
    (g) etching the silicon layer until the insulating layer is exposed, the remaining resin serving as a mask for said etching;
    (h) producing electric contacts and source and drain electrodes of the transistor; and
    (i) eliminating the remaining resin and forming a plurality of staircase steps on the edges of the silicon layer by an equal number of successive and partial etching operations of said silicon layer, the remaining resin being used on each occasion as a mask and itself being etched isotropically over a limited thickness following each etching of the silicon layer.

2. A process for producing a thin film transistor with a self-aligned gate with respect to the drain and source thereof, produced in accordance with the process of claim 1, wherein said step of producing electric contacts comprises depositing an n+ hydrogenated amorphous silicon layer on the thick amorphous silicon layer for producing ohmic contacts; and further including depositing a conductive layer on the n amorphous silicon layer for producing the source and drain electrodes of the transistor;

wherein the thick amorphous silicon layer has staircase-type edges constituted by at least two steps.

* * * * *